United States Patent [19]

Petersen et al.

[11] Patent Number: 4,676,571

[45] Date of Patent: Jun. 30, 1987

[54] LEADED CHIP CARRIER CONNECTOR

[75] Inventors: Richard W. Petersen, Doylestown; James C. Larkin, III, Chalfont, both of Pa.

[73] Assignee: Thomas & Betts Corporation, Raritan, N.J.

[21] Appl. No.: 757,995

[22] Filed: Jul. 23, 1985

[51] Int. Cl.[4] .............................................. H01R 9/09
[52] U.S. Cl. .................................... 439/261; 439/68
[58] Field of Search ........... 339/17 CF, 75 M, 75 MP

[56] References Cited

U.S. PATENT DOCUMENTS

| | | | |
|---|---|---|---|
| 3,915,538 | 10/1975 | Gruhn, Jr. et al. | 339/75 |
| 3,942,854 | 3/1976 | Klein et al. | 339/17 |
| 3,944,311 | 3/1976 | Sprenkle et al. | 339/45 |
| 4,089,575 | 5/1978 | Grabbe | 339/17 CF |
| 4,130,327 | 12/1978 | Spaulding | 339/17 |
| 4,152,038 | 5/1979 | Inouye et al. | 339/75 |
| 4,260,210 | 4/1981 | Babuka et al. | 339/91 |
| 4,312,555 | 1/1982 | Donaher et al. | 339/17 |
| 4,351,580 | 9/1982 | Kirkman et al. | 339/17 |
| 4,375,309 | 3/1983 | Griffin | 339/75 |
| 4,377,319 | 3/1983 | MacDougall | 339/17 CF |
| 4,381,131 | 4/1983 | Demnianiuk | 339/17 CF |
| 4,420,207 | 12/1983 | Nishikawa | 339/75 |
| 4,449,770 | 5/1984 | Grabbe et al. | 339/17 |
| 4,456,318 | 6/1984 | Shibata et al. | 339/17 |
| 4,461,525 | 7/1984 | Griffin | 339/75 |
| 4,465,898 | 8/1985 | Orcutt et al. | 174/52 |
| 4,470,650 | 9/1984 | Lundergan | 339/17 CF |
| 4,491,378 | 1/1985 | Crawford | 339/17 CF |
| 4,536,955 | 8/1985 | Gudgeon | 339/17 CF |
| 4,553,805 | 11/1985 | Aikens | 339/75 MP |

Primary Examiner—John McQuade
Attorney, Agent, or Firm—Robert M. Rodrick; Salvatore J. Abbruzzese

[57] ABSTRACT

A chip carrier connector for mounting to a printed circuit board is disclosed. The connector includes a housing for supporting the chip carrier and a cover moveably supported thereover for retentively accommodating the chip carrier in the connector. The contacts of the connector are preformed to have a deflection bias to retentively engage the leads of the chip carrier upon cam actuation of the contacts.

10 Claims, 5 Drawing Figures

LEADED CHIP CARRIER CONNECTOR

FIELD OF THE INVENTION

The present invention relates generally to an electrical connector for accommodating a leaded chip carrier such as an integrated circuit carrier and more specifically relates to a cam actuated connector for supporting a leaded plastic chip carrier for connection to a printed circuit board.

BACKGROUND OF THE INVENTION

The importance of integrated circuit semiconductors in the electronic industry is well known. These circuits have revolutionized the industry. Employed in miniaturized form and made into chips these circuits can be utilized in great numbers in very little space such as on printed circuit boards.

Integrated circuits formed into chips may be packaged in a rectangular plastic carrier having conductive leads extending from each marginal edge thereof. In order to connect this leaded chip carrier to a printed circuit board an electrical connector or socket is employed which provides mechanical and electrical connection between the conductive leads of the chip carrier and conductive traces on a printed circuit board.

A typical leaded chip carrier, such as that shown in U.S. Pat. No. 4,465,898, includes an enclosure or body typically formed of an epoxy plastic and having a plurality of J-leads extending therefrom around its periphery. Connectors for accommodating plastic chip carriers typically include a rectangular (usually square) housing which supports around the perimetrical edge thereof a plurality of spring contacts. The body includes a central cavity into which the spring contacts extend. The spring contacts of the connector are biased into the cavity of the body such that upon insertion of the plastic chip carrier into the cavity there is substantial engagement between the J-leads of the plastic chip carrier and the spring contacts of the connector. In order to insure adequate electrical connection between the spring contacts and the J-leads a high degree of insertion force is necessary to insert the plastic chip carrier into the connector. While the necessary force may vary from connector to connector and carrier to carrier depending on construction, thickness and material composition, a high degree of manual force is usually necessary to insert the plastic chip carrier into the connector. That is especially true with plastic chip carriers having leads which may number as high as 68 or more as is now desired for increased circuit density. It is apparent that the force needed to urge the plastic chip carrier into engagement with the contacts of the connector may be so great as to render manual insertion by the user difficult. As difficult as insertion may be, extraction of the plastic chip carrier from the connector is even more difficult. Leaded plastic chip carriers, presently on the market, require the use of an extraction tool to remove the chip carrier from connector. Use of an extraction tool is necessitated in that the force to remove the chip carrier from the connector is so great that the user requires a mechanical advantage to make such extraction. A typical extraction tool is a wheel puller having a screw-type shaft which supplies the mechanical advantage.

It is also apparent that the force exerted on each of the leads of the chip carrier by the individual contacts is also great. Thus, upon movement the contacts into engagement with the leads of the package significant deflection of the contacts take place. Without controlling the amount of deflection and direction of the deflection of the contacts, the contacts may be damaged upon repeated insertion and removal of the chip carrier in the housing.

It is accordingly desirable to provide a chip carrier connector which retains the carrier in the housing with a high degree of retention force, yet is operable without need of a special insertion and extraction tool which provides a mechanical advantage. Also, the connector should accommodate contacts which are required to exhibit significant deflection without damage thereto.

SUMMARY OF THE INVENTION

It is an object of the present invention to provide a suitable electrical connector for accommodating a chip carrier which would provide a high retention force for the chip carrier in the connector.

It is a further object of the present invention to provide a high retention force chip carrier connector which is operable without use of insertion or extraction tools which would provide a mechanical advantage to the user.

It is a still further object to provide a chip carrier connector having contacts which exhibit a high degree of deflection upon engagement with the contact elements of the chip carrier without damaging the contacts.

In the efficient attainment of the foregoing and other objects, the invention looks toward providing an electrical connector for accommodating a chip carrier having plural electrical elements thereon. A connector housing includes a central cavity for insertable receipt of the chip carrier. A plurality of electrical contacts extend into the cavity for engagement with the chip carrier elements. Cam means is actuatable for urging the contacts against the carrier elements to provide electrical connection and further provide a high degree of retention force for the chip carrier in the connector. The engagement of the contacts and the carrier element provides an engagement force in the direction of insertion of the chip carrier whereby the chip carrier is retentively held in the housing.

In a particularly employed embodiment, described hereinbelow, the connector accommodates a leaded chip carrier. A moveable cover including a cam surface is actuatable to urge electrical contacts against the leads of the chip carrier in a downward direction. Controlled deflection of the electrical contacts is achieved by placing a bow in a portion of the contact to deflect that portion away from the lead upon cam actuation.

Other objects and features of the present invention will be evident from the following detailed description of the preferred embodiment.

DETAILED DESCRIPTION OF THE PREFERRED EMBODIMENT

Figure 1:
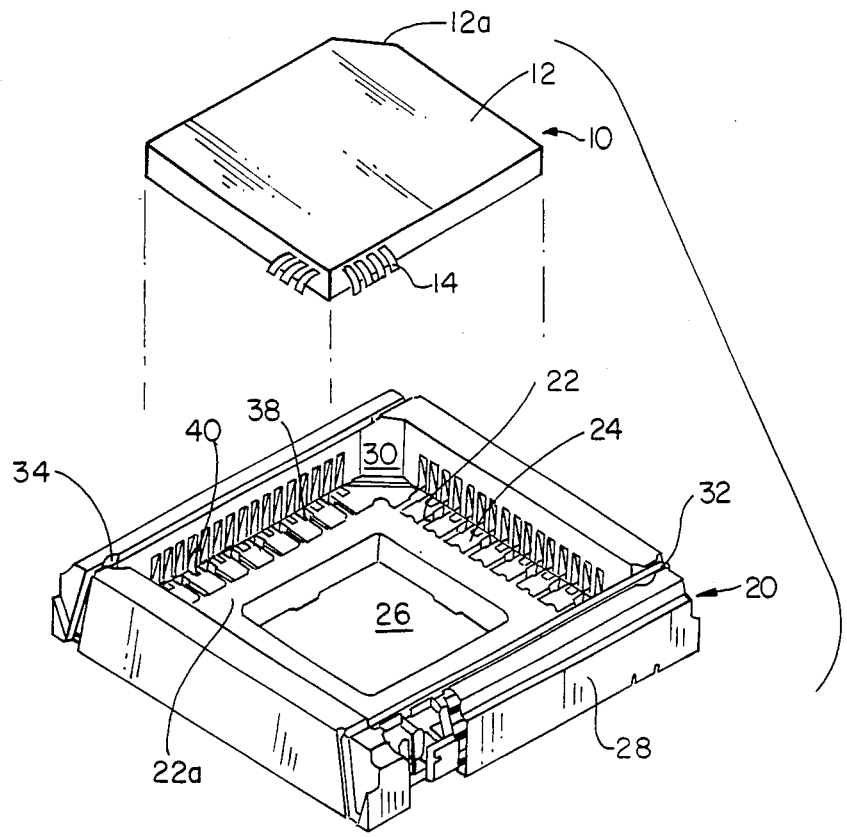
FIG. 1 shows in partially broken away perspective view, the chip carrier connector of the present invention with a leaded chip carrier shown thereabove.

Referring to FIG. 1, chip carrier 10 is shown having basically a square shape. Carrier 10 includes an enclosure 12 and a plurality of leads 14 extending along the perimetrical edge thereof. Leads 14 are constructed of an electrically conductive metallic material, for example a copper alloy, and are formed into an industry designated "J" pattern. The leads 14 are commonly referred to as J-leads. Enclosure 12 is typically formed of a suitable plastic, for example epoxy as is readily known in the art. Enclosure 12 encloses a electronic semiconductor chip (not shown) which is suitable electrically connected to a lead frame which connects to J-leads 14. One flattened corner 12a is provided as a polarization feature to prevent incorrect insertion of carrier 12.

Also shown in FIG. 1 is the electrical connector 20 of the present invention. Connector 20 includes a substantially square body 22, which is constructed typically of an insulative plastic material, having four side walls 24. Body 22 defines between side walls 24 a central cavity 26 which accommodates and houses chip carrier 10 therein. As illustrated in FIG. 1, cavity 26 extends through the bottom of connector housing 20 to provide an air-cooling opening for chip carrier 12. However, it is not essential that the cavity extend through the bottom of connector 20.

Connector 20 further includes a four-walled, open rectangular (usually square) cover 28 which is moveably supported over walls 24 of body 22. As will be described in greater detail hereinbelow, cover 28 is moveable in a vertical position, as shown in FIG. 1, to secure a chip carrier 10 in connector 20. In order to accommodate chip carrier 10, cover 28 has a substantially open central area 30 which is aligned and in communication with central cavity 26. Body 22 of connector 20, further includes a pair of hingedly attached levers 32 and 34 on opposite sides thereof for supporting cover 28 in one of two different vertical positions as will be described in greater detail hereinbelow.

Figure 2:
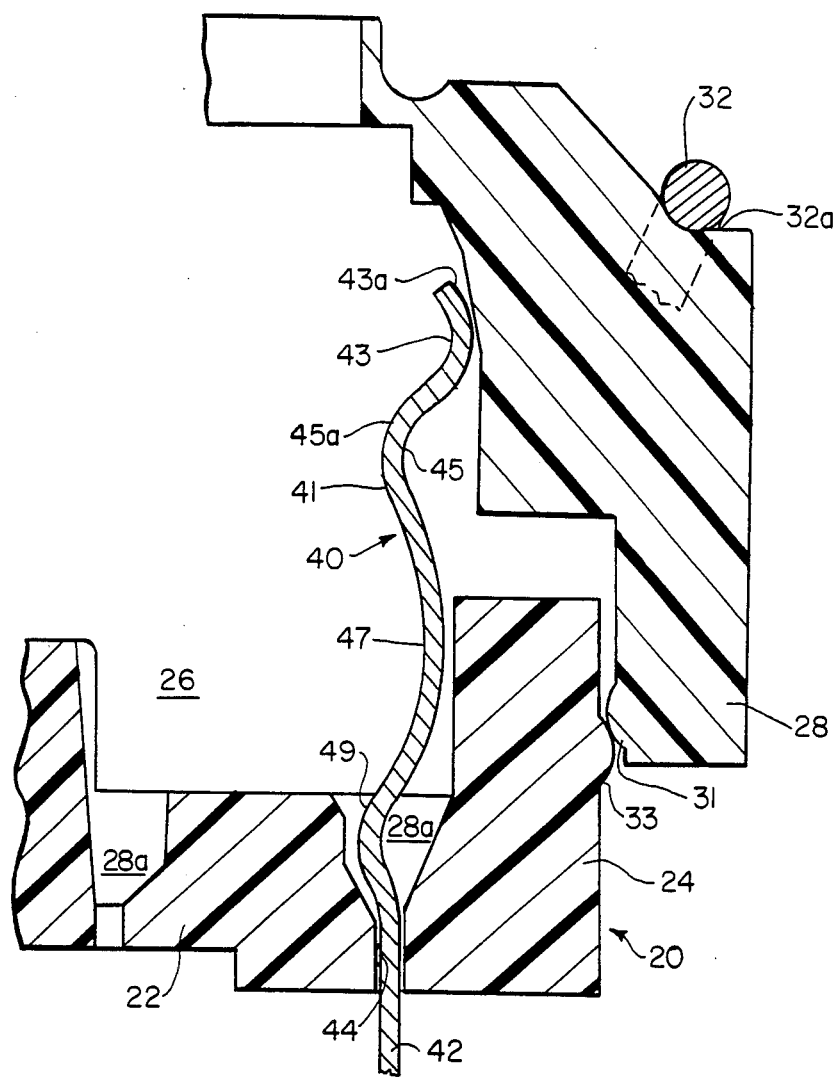
FIG. 2 is a sectional fragmented showing of a portion of the connector of FIG. 1 employing therein one of a plurality of electrical contacts.

Referring additionally to FIG. 2, body side walls 24 each include a plurality of slotted channels 28a each opening into central cavity 26. Each slotted channel 28a supports and separates an electrically conductive contact 40. In the present illustrative embodiment, as shown in FIG. 1, each side wall 24 is segmented by 16 channels thus providing a 68 contact connector. However, it is understood that the invention may also be employed with a connector having higher or lower numbers of contacts.

Each contact 40 is an elongated member having a free extent 41 which extends adjacent central cavity 26 and a tail extent 42 which extends below and externally of body 22 of connector 20. Tail extent 42 provides for external electrical connection with conductive traces on a printed circuit board (not shown) or similar device. A portion of contact 40 is retainably supported in body 22 by force fitting or other conventional securement means. In the present illustrative embodiment detent means 44 is provided in slotted channel 28a. Free extent 41 of contact 40 is formed to have a torturous profile with several alternating contours therealong. The first major contour is cam engagement portion 43 at the distal free end of contact 40. Cam engaging portion 43 is bowed with a concavity facing central cavity 26. This construction presents a curved bearing surface 43a adjacent an inside wall of cover 28 for engagement therewith as will be described in further detail hereinafter. A second major contour is lead engaging portion 45 spaced from cam engagement portion 43, which is bowed in the opposite direction from that of cam engagement portion 43. This construction presents a curved bearing surface 45a adjacent cavity 46 for engagement with J-lead 14 upon insertion of package 12 into cavity 26 as will be described in detail hereinafter. A third major contour is deflection portion 47 which is spaced from lead engaging portion 45 and is bowed in the direction opposite therefrom This construction provides for compressive movement of contact 40 upon actuating movement of cover 28. A minor bowed section 49 is provided in the lower extent of contact 40 in channel 28a again to provide for compressive deflection of contact 40.

Having described basic elements of connector 20 of the present invention its operation may now be described with reference to FIGS. 2 through 4. Referring initially to FIG. 2, connector 20 is shown in a pre-connection position with cover 28 raised vertically from housing 22. Contact 40 is in an unbiased or unstressed position with the free extent 41 extending upwardly from body 22. Latch 32 is shown seated in a first recess 32a of cover 28 which permits the cover to remain in its vertically raised position. A pair of cooperating detents 31 and 33 on cover 28 and housing 22 respectively, permit such vertical movement and support the cover 28 in its "up" position.

Figure 3:
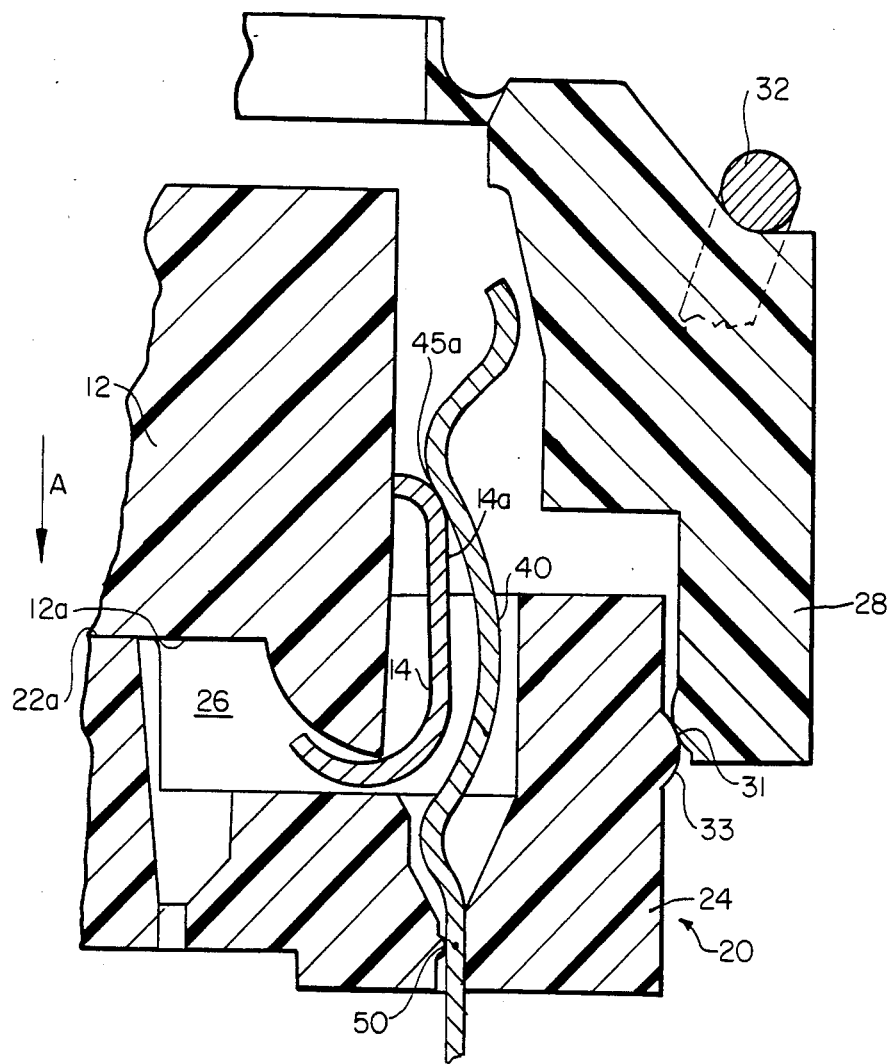
FIG. 3 is a sectional showing similar to that of FIG. 2 with a leaded chip carrier inserted therein.

Referring now to FIG. 3, chip carrier 12 is inserted downwardly, as is substantially shown by arrow A, through central opening 30 (FIG. 1) of cover 28 and into central cavity 26 of housing 22. As the chip carrier is inserted, J-lead 14 extending therefrom engages the curved bearing surface 45a of lead engaging portion 45, thereby deflecting contact 40 about skematically represented pivot point 50, away from cavity 26. As chip carrier 12 is inserted into cavity 26, the outside surface 14a will slide against contact surface 45a to provide a wiping action upon insertion, thereby assuring electrical contact therebetween. As entry of the chip carrier causes movement of contacts 40, against the leads 14, the carrier will be inserted against some low resistive force, thus making the connection a low insertion force (LIF) connection. The bottom surface 12a of chip carrier 12 will contact support surfaces 22a of body 22 such that the chip carrier will be seated in body 22. In the position shown in FIG. 3, chip carrier 12 will be accommodated in connector 20 with a low retention force which enables easy manual insertion and removal of the chip carrier.

Figure 4:
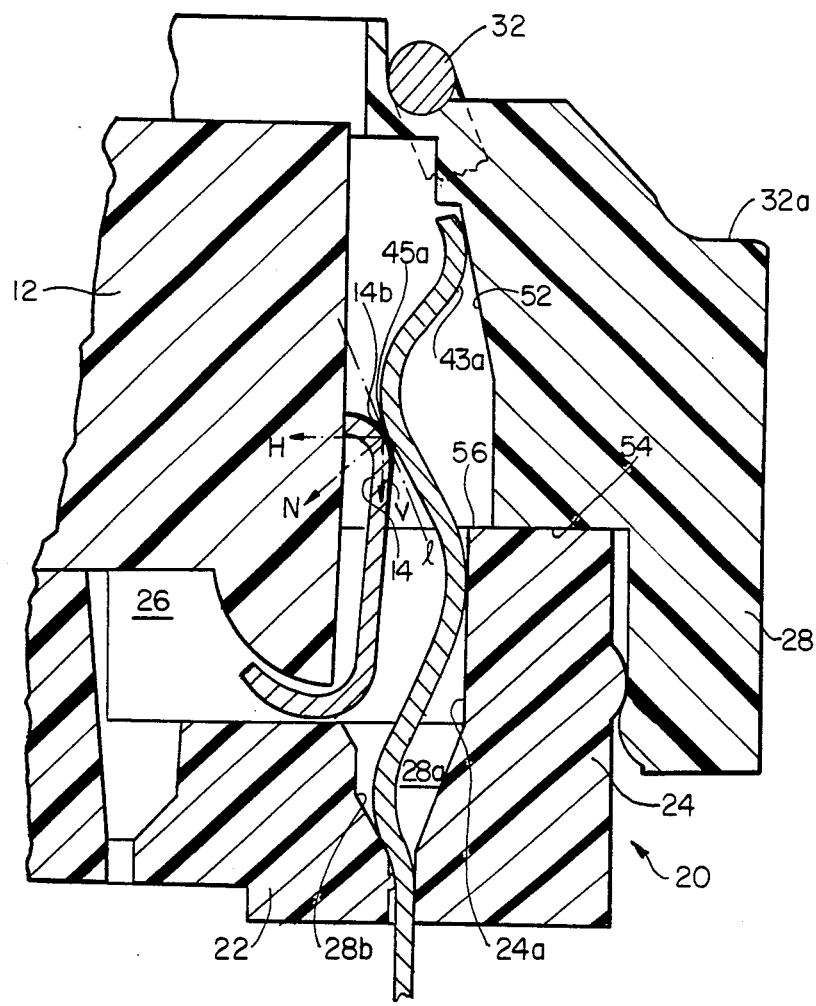
FIG. 4 is a sectional showing similar to that of FIGS. 2 and 3 with the cover shown in the actuated position.

Referring now to FIG. 4, cover 28 may be brought down vertically over chip carrier 12 to secure the chip carrier in cavity 26. As cover 28 is brought down, curved bearing surface 43a of cam engagement portion 43 engages an inside tapered wall 52 of cover 28. As the cover is progressively brought down, contact 40 will deflect at several locations. Initially, cam engaging portion 43 will deflect inwardly toward chip carrier 12 urging lead engaging portion 45 into tighter engagement with J-lead 14. Further, deflection portion 47 will deflect outwardly away from chip carrier 12 due to its pre-formed bowed construction until it engages inside vertical surface 24a of wall 24 which serves as a stop member preventing over stressing of contact 40. The bow placed in deflection portion 47 will allow controlled directional deflection of contact 40. Bowed portion 49 will engage side wall 28b of channel 28a which also serves as a stop member preventing over stressing of the contact 40. The cover is brought down until shoulder 54 of cover 28 rests on top surface 56 of wall 24. In this position contact 40, at lead engaging portion 45, exerts a high degree force on lead 14 of chip carrier 12.

It is noted that substantially tangential contact is made between the curved bearing of surface 45a and curved portion 14b of lead 14. This tangential contact is represented by line L. The force which urges contact 40 into engagement with lead 14 is normal to tangent line L, as represented by vector N. It is further noted that normal force vector N is a resultant of a vertical vector V and a horizontal vector H. Thus the normal force is directed in a substantially downward direction and serves to hold chip carrier 12 securely in cavity 26 with a high degree of retention force. By contacting the J-lead 14 on its curved upper portion 14b there is resultant tangential contact made along line L which provides a normal force which is substantially downwardly directed below the horizontal plane. if contact portion 45a were to engage lead 14 along the lower straight section 14a thereof, there would be a tendency for the spring bias of the contact to urge the chip carrier upward out of its retained position in cavity 26. This may be a problem encountered upon shock, vibration or flexing of the printed circuit board on which connector 20 is mounted. Thus, by providing a normal vector which is substantially downward in direction, the chip carrier is more securely retained in cavity 26.

After the cover is moved down into its seated position securely retaining chip carrier 12 in cavity 26 pivotal latch 32 may be moved from its up position, shown in FIG. 3, to its locked position, shown in FIG. 4. This will secure the cover 28 down over body 22. The spring engagement of contact 40 with leads 14 will naturally exert a slight upward pressure in direction opposite normal vector N. This will urge cover 28 against pivotal latch 32 securely holding the latch 32 in place.

To remove the chip carrier 12 the steps just described are performed in the opposite manner. Latch 32 is moved down from its seated position, shown in FIG. 4, to the position, shown in FIG. 3. The cover may then be moved upward to release the high contact force between contacts 40 and leads 14. The chip carrier 12 may then be removed from cavity 26 with only a light force of contacts 40 against leads 14 being exerted, as shown in FIG. 3.

Figure 5:
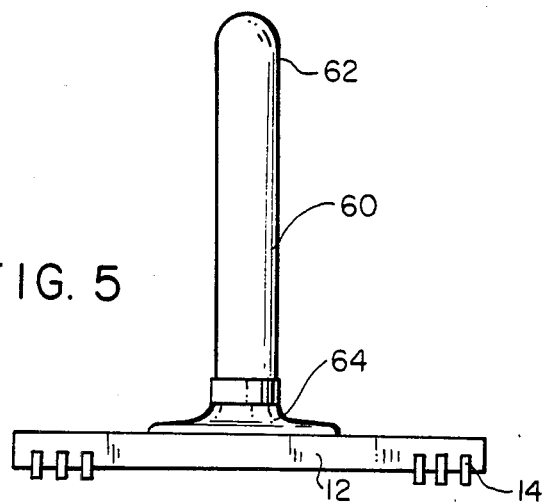
FIG. 5 is a front plan view of an extraction tool useful in removing the chip carrier of FIG. 1.

While no special insertion or extraction tools are needed to use the connector of the present invention, a small grabbing tool may be necessary to extract carrier 12 in that it presents no grabbing surface once accommodated in cavity 26. Referring to FIG. 5, a simple extraction tool is provided. Tool 60 is a plunger-type tool having a central main shaft 62 connected at one end thereof to a suction-cup device 64. Tool 60 may be placed on top of chip carrier 12, whereupon the suction cup 64 will engage the upper surface thereof in a conventional manner to assist in insertion and removal of the device.

Various changes to the foregoing describe and shown structures would now be evident to those skilled in the art. Accordingly, the particularly disclosed scope of the invention is set forth in the following claims.

What is claimed is:

1. An electrical connector for accommodating a chip carrier having plural electrical elements thereon, said connector comprising:
    a housing having a central cavity for insertable receipt of said chip carrier in an insertion direction;
    a plurality of elongate electrical contacts supported in said housing having a free end extending into said cavity, each of said contacts having at the free end thereof a cam engagement portion, an element engaging portion spaced therefrom and a deflection extent spaced from said element engaging portion, said deflection extent having a preformed configuration to deflect away from said central cavity;
    cam means actuatable for engaging said cam engagement portions and for urging said element engaging portions against said electrical elements of said chip carrier and for providing an engagement force thereagainst in said insertion direction whereby said chip carrier is retentively held in said housing; and
    a stop wall formed on said housing for limiting the amount of deflection of said deflection extent.

2. An electrical connector in accordance with claim 1 wherein said cam means includes a cover having a cam surface for engagement with cam engagement portion of said contact, said cover being moveable from a first position non-engaging said contacts to a second position engaging said contacts.

3. A connector in accordance with claim 2 wherein said housing includes a latch for securing said cover in said second position.

4. A connector in accordance with claim 3 wherein said cover includes a central opening for permitting passage of said chip carrier into said housing cavity.

5. A connector in accordance with claim 1 wherein said cam engagement portion has a deflectable bowed extent, bowed away from said central cavity.

6. A connector in accordance with claim 1 wherein said element engagement portion has a deflectable bowed extent, bowed toward said central cavity.

7. A connector in accordance with claim 6 wherein said deflection extent is bowed in a direction away from said central cavity.

8. An electrical connector for accommodating a chip carrier having plural J-leads extending therefrom, said J-leads each having a curved upper extent and a depending linear extent, said connector comprising:
    a housing having a central cavity for receipt of said chip carrier;
    plural deflectable electrical contacts supported in said housing having a first extent for contacting said J-leads, a second extent for external electrical connection and a cam engaging extent adjacent said first extent and distally spaced from said second extent, said first contact extent having a lead engaging portion for engaging said lead along said curved upper extent;
    cam means for initially engaging said cam engaging extent and then urging said lead engaging portion against said curved upper extent of said J-leads; and
    stop means on said housing for engagement with said first extent for limiting the deflection of said electrical contacts.

9. An electrical connector in accordance with claim 8 wherein said carrier is inserted into said housing cavity in a given direction, and wherein said lead engaging portion engages said lead in a direction substantially coincident with said given direction.

10. An electrical connector in accordance with claim 9 wherein said first extent of each of said contacts includes a deflection extent spaced from said lead engaging portion, said deflection extent having a pre-formed configuration to deflect upon actuation of said cam means.

* * * * *